United States Patent [19]
Shimizu

[11] 4,453,078
[45] Jun. 5, 1984

[54] ION SOURCE
[75] Inventor: Ryuichi Shimizu, Minooshi, Japan
[73] Assignee: JEOL Ltd., Tokyo, Japan
[21] Appl. No.: 385,940
[22] Filed: Jun. 7, 1982
[30] Foreign Application Priority Data
Jun. 12, 1981 [JP] Japan .................. 56-90500
[51] Int. Cl.³ .......................... H01J 27/22
[52] U.S. Cl. .................... 250/425; 313/163;
313/232; 313/362.1; 315/111.81; 250/427
[58] Field of Search ............ 250/425, 427, 423 R;
315/111.81; 313/163, 232, 362
[56] References Cited
U.S. PATENT DOCUMENTS
3,644,731  2/1972  Eloy ...................... 250/425 X
4,318,029  3/1982  Jergenson ............. 250/423 R X
4,318,030  3/1982  Jergenson ............. 250/423 R X
4,328,667  5/1982  Valentian et al. ........ 313/163 X Primary Examiner—Alfred E. Smith
Assistant Examiner—Jack I. Berman
Attorney, Agent, or Firm—Webb, Burden, Robinson & Webb

[57] ABSTRACT

A reservoir, extracting electrode and circular tungsten filament are maintained at high positive D.C. potential relative to a grounded electrode. Thermal electrons emanated from the filament irradiates and heats the bottom of the reservoir. As a result, powdered CsI held in the reservoir is melted and then forms a liquid CsI cone-shaped portion below the capillary formed at the reservoir bottom. Vaporized CsI molecules are created by further heating the cone-shaped portion, and are ionized by electron beam irradiation, so that a Cs⁺ ion beam is obtained.

8 Claims, 2 Drawing Figures

ION SOURCE

BACKGROUND OF THE INVENTION

The present invention relates to improvements in an ion source particularly for use in an ion microanalyzer.

An ion microanalyzer is an apparatus for obtaining a magnified image of the surface of the specimen on the screen of a cathode ray tube (CRT). A primary ion beam is generated in an ion source and is scanned over the surface of the specimen. The incident beam causes secondary ions to be emitted from the specimen surface. The secondary ions are detected and the detection signal is used to modulate the intensity of the electron beam in the CRT. Of course, the primary ion beam is scanned over the specimen in synchronism with the scanning of the electron beam in the CRT. A background discussion of certain ion microprobes is set forth in *McGraw-Hill Yearbook of Science and Technology 1973* (McGraw-Hill 1974).

Generally, for obtaining a clear image of the specimen surface, it is necessary to increase the brightness (intensity) of an ion source as much as possible. Further, a cesium Cs+ ion beam or another alkali metal ion beam as a primary ion beam is required for certain observation purposes. However, operation of conventional ion sources for generating alkali metal ion beam is very troublesome. Almost all of these conventional ion sources use a sample of the alkali metal which is a substance which reacts furiously in the atmosphere.

SUMMARY OF THE INVENTION

An object of the present invention is to provide an ion source having high brightness.

Another object of the present invention is to obtain a stable Cs+ ion beam or some other alkali metal ion beam using chemical compounds of alkali metals which are stable in atmosphere.

Briefly according to this invention there is provided an ion source comprising elements positioned along an optical axis. A reservoir for holding compounds of alkali metal, such as CsI, has a capillary extending from the interior to the exterior of the reservoir. The reservior preferably is fabricated of tantalum or tungsten. In a preferred embodiment, the capillary comprises a bore symmetrical with the optical axis of the source. Spaced from the reservoir is an extracting electrode having an opening therein. Where, for example, the optical axis of the source is vertical and the reservoir is at the top end of the axis, the capillary is in the bottom of the reservoir and the extracting electrode is arranged below it.

An electron source (for example, heated filament) for generating thermal electrons is spaced beyond the extracting electrode from the reservoir. A grounded electrode having an opening therein to pass the ion beam is spaced beyond the electron source from the reservoir. A high D.C. voltage supply, say 15KV, maintains the reservoir at a positive potential relative to the grounded electrode. This potential accelerates the primary ions. An extracting D.C. voltage supply, say 3KV, maintains the extracting electrode at a negative potential voltage to the reservoir. This potential accelerates the thermal electrons that heat and ionize the alkali compounds to form the primary ions.

According to a preferred embodiment, a needle supported from the reservoir passes through the capillary and has an apex that terminates just beyond the external surface surrounding the capillary opening.

In use, the reservoir is filled with powdered compounds of alkali metals that melt as the reservoir and/or needle are heated by the bombardment of the thermal electrons from the filament. The melted compound flows out of the capillary forming a substantially cone-shaped surface extending from the opening. The thermal electrons bombarding the cone-shaped surface cause vaporization of the compound and the compound vapor is then ionized by the thermal electrons. The positive ions are then accelerated toward the specimen.

DESCRIPTION OF THE PREFERRED EMBODIMENTS

Figure 1:
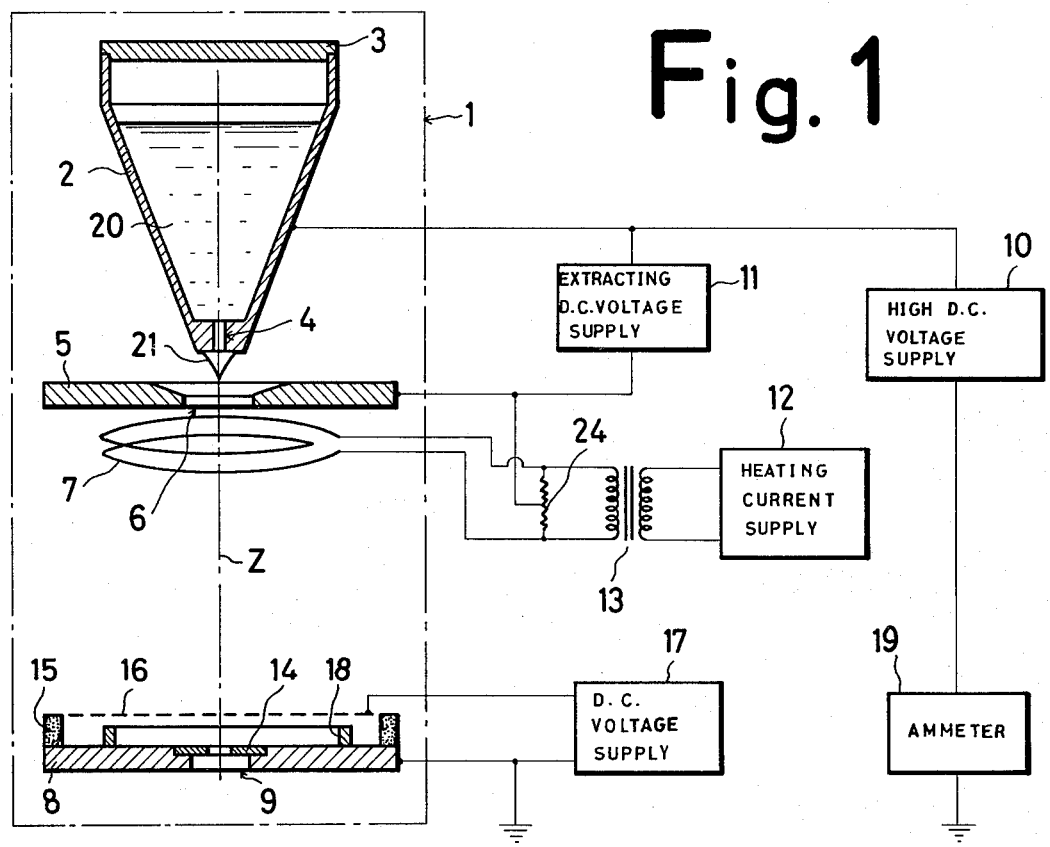
FIG. 1 is a schematic view illustrating one embodiment of the present invention.

Referring now to FIG. 1, a structure defining a column 1 upon which a vacuum may be drawn encloses and supports various elements of an ion source arranged symmetrically with respect to the optical axis Z of the ion source. Typically, the column or an extension thereof also encloses and supports elements of an ion optical system including lenses and deflection devices for focussing and scanning the ion beam. The optical axis of the ion optical system might simply be an extension of the axis of the ion source disclosed and claimed herein.

The ion source comprises a funnel-shaped reservoir 2 made of tantalum (Ta), tungsten (W) or some other metal supported in the column 1. The reservoir has a cover 3 for covering its upper opening, and a capillary 4 having a diameter of about 0.5 to 2 mm formed at the bottom of the reservoir 2. As shown in FIG. 1, the capillary may comprise a small bore in the lower end of the reservoir which defines a bottom face extending away from the bore and which bottom face is generally perpendicular to the axis of the bore. The axis of the bore is colinear with the optical axis of the entire source. Under the reservoir 2 is positioned an extracting electrode 5 having an opening 6. Under the extracting electrode is positioned a circular (twice-turned) tungsten filament 7 for emanating thermal electrons. Under the filament is grounded electrode 8 having an opening 9. These items are arranged along the optical axis. In the embodiment illustrated, the axis is more or less vertical and thus the term "under" has a simple meaning. The optical axis of the source might be oriented other than vertical in which event the elements of the source are arranged along the axis moving away from the reservoir in the same order as the elements of the illustrated embodiment.

The reservoir 2, extracting electrode 5 and filament 7 are attached to the inner wall of the column 1 by insulators (not shown), and their potential is kept at high positive potential relative to ground potential. For this purpose, a high D.C. voltage supply 10 maintains the reservoir 2 at positive high D.C. voltage, for example, +15KV, relative to ground potential, and an extracting D.C. voltage supply 11 maintains the extracting electrode 5 at negative D.C. voltage, for example −3KV, relative to the reservoir 2. Both ends of the filament 7 are connected to a heating current (A.C.) supply 12 via an insulating transformer 13. Between the secondary coil terminals of the transformer 13 and connecting them is a balance resistor 24. The middle point of the resistor 24 is connected to the extracting D.C. voltage supply 11 so that the filament 7 is kept at the same potential of the extracting electrode 5.

The grounded electrode 8 has an aperture plate 14 near the opening 9 for restricting the angle of the ion beam diverging from the space near the opening 6 of the extracting electrode 5 along the optical axis Z. The upper surface of the grounded electrode 8 is covered with a mesh electrode 16 fixed to the grounded electrode 8 by means of a ring-shaped insulator 15. The potential of the mesh electrode 16 is kept at several hundred volts, for example at −200V, relative to the grounded electrode 8 by means of a D.C. voltage supply 17. Radially inward of the insulator 15, a ring-shaped member 18 having electric conductivity is fixed on the upper surface of the grounded electrode 8.

An ammeter 19 may be connected to the ground terminal of the high D.C. voltage supply 10 for monitoring the total current intensity of the ion beam which is generated in the space near the opening 6 of the extracting electrode 5.

In order to generate the ion beam using the embodiment of FIG. 1, it is necessary to fill the reservoir 2 with the powder of cesium iodide CsI (or another chemical compound of alkali metals, for example CsCl) 20 and to control the voltage supplies 10, 11, 17 and the alternating current supply 12. By so doing, thermal electrons emitted from the tungsten filament 7 are directed to the bottom of the reservoir 2 due to the electrostatic field formed in the space between the reservoir 2 and the tungsten filament 7. As a result, the bottom of the reservoir 2 and the CsI powder near the bottom are heated to over the melting point of CsI (621° C.) and melted. The melted CsI flows through the capillary 4 downward so that the liquid CsI forms a substantially cone-shaped portion 21 on the bottom face of the reservoir 2. For this cone formation, it is necessary for the electrostatic stress normal to the surface of the cone-shaped portion 21 to be exactly balanced by the surface-tension force. In this condition, the apex radius of the substantially cone-shaped portion 21 is very short, and a very strong electric field is formed near the apex of the cone-shaped portion 21. As a result, after cone formation, almost all of the thermal electrons that emanated from the filament 7 converge upon the apex of the cone-shaped portion 21, and the liquid CsI is heated to the boiling point of CsI (1280° C.) and is evaporated. The evaporated CsI molecules near the apex of portion 21 are ionized due to collision with the thermal electrons accelerated by the strong electric field. In this ionization process, various kinds of ions, for example Cs+,I−−,I−−, are generally created. The positive cesium ion (Cs+) is a main component created by ionization of CsI. The (Cs+) ions are accelerated by the electric field formed between the cone-shaped portion 21 and the extracting electrode 5, and pass through the opening 6 of the extracting electrode 5, and further are accelerated by the electric field formed between the extracting electrode 5 and the grounded electrode 8. Thus, a (Cs+) ion beam having high brightness and high current intensity is obtained along the optical axis Z.

The many secondary electrons, which are released from the grounded electrode 8 by the Cs+ ion beam impact, are suppressed by the electric field formed between the mesh electrode 16 and the grounded electrode 8 so that the secondary electrons cannot be accelerated toward the cone-shaped portion 21. If many secondary electrons release from the grounded electrode 8 are accelerated toward the cone-shaped portion 21, it becomes difficult to obtain stable ion beam because of overheating the cone-shaped portion 21. Also, these secondary electrons make it difficult to monitor precisely the total current intensity of the ion beam. The particles sputtered from the grounded electrode 8 cannot coat the inner wall of the ring-shaped insulator 15 because of the existence of the ring-shaped member 18.

Figure 2:
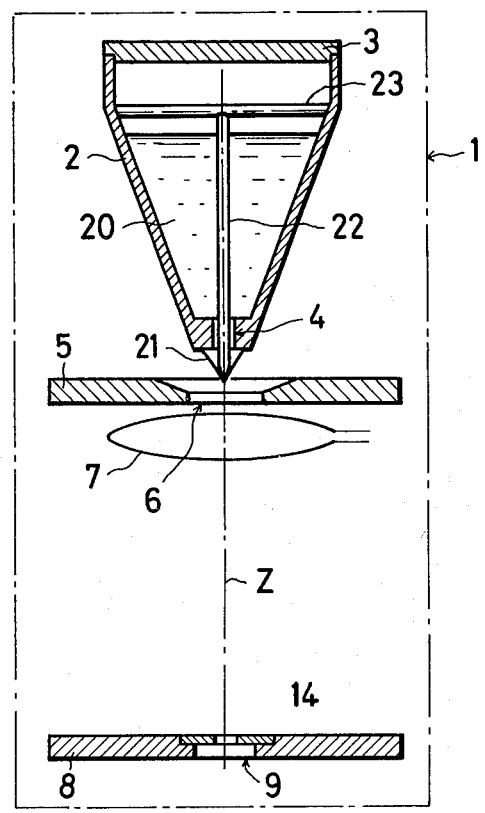
FIG. 2 is a schematic view illustrating essential parts of another embodiment of the invention.

FIG. 2 shows the essential part of another embodiment according to the present invention. In the figure, the constituent parts having index numbers corresponding to those in FIG. 1 are identical. In this embodiment, a needle 22 is made of tantalum, tungsten or another metal is incorporated in the reservoir 2. One end of the needle 22 is fixed to the inner wall of the reservoir 2 by means of the supporting rod 23 so that the center axis of the needle 22 is arranged on the optical axis Z and through the capillary 4. And the other apex end of the needle 22 is sharp and projects slightly from the lower surface of the reservoir 2. In this embodiment, almost all of the thermal electrons that emanated from the circular tungsten filament 7, which is once-turned, converge upon the apex of needle 22 just after starting the operation of the ion source. Accordingly, the CsI powder 20 is melted in shorter time than that in the case of the embodiment shown in FIG. 1, and liquid CsI flows through the gap between the needle 22 and the capillary 4, and then the sharp needle apex is covered with CsI liquid film. The outer shape of the CsI liquid film becomes cone-shaped like portion 21 in FIG. 1. The CsI liquid film at the apex of the needle 22 is heated to boiling point and is evaporated. Consequently, the evaporating CsI molecules collide with the thermal electrons that emanated from the filament 24 so that Cs+ ion beam is created. Additionally, if the total current intensity of the Cs+ ion beam is weak, means for suppressing the secondary electrons released from the grounded electrode surface by ion impact is not necessary as shown in the embodiment of FIG. 2.

Having thus defined the invention with the detail and particularity required by the Patent Laws, what is claimed and desired protected by Letters Patent is set forth in the following claims:

1. An ion source having elements positioned along an optical axis comprising:
   (a) a reservoir for holding a compound of an alkali metal, said reservoir forming a capillary from the interior to the exterior of the reservoir, said capillary being symmetrical with the optical axis of the source at the open end thereof;
   (b) an extracting electrode having an opening spaced from the capillary of the reservoir;
   (c) an electron source for generating thermal electrons, spaced beyond the extracting electrode from the reservoir being at about the same potential as the extracting electrode such that electrons emitted from the source are accelerated toward the opening of the reservoir for bombarding the compound to heat and ionize it;
   (d) a grounded electrode having an opening, said grounded electrode being spaced beyond the electron source from the reservoir;
   (e) a high D.C. voltage supply for maintaining the reservoir at positive high potential relative to the grounded electrode; and (f) an extracting D.C. voltage supply for maintaining the extracting electrode at negative potential relative to the reservoir.

2. An ion source according to claim 1 in which said reservoir is made of tantalum.

3. An ion source according to claim 2 in which said grounded electrode incorporates a mesh electrode arranged above grounded electrode maintained at negative several hundred volts relative to the grounded electrode.

4. An ion source according to claim 1 in which said reservoir is made of tungsten.

5. An ion source according to claim 1 in which said electron source comprises a circularly turned tungsten filament.

6. An ion source having elements positioned along an optical axis comprising:
   (a) a reservoir for holding a chemical compound of alkali metal, said reservoir forming a capillary from the interior to the exterior of the reservoir, said capillary being symmetrical with the optical axis of the source at the open end thereof;
   (b) a needle arranged through the center of the capillary of the reservoir so that the apex end of the needle projects slightly beyond the exterior surface of the reservoir;
   (c) an extracting electrode having an opening, spaced from the capillary of the reservoir;
   (d) an electron source for generating thermal electrons, spaced beyond the extracting electrode from the reservoir being at about the same potential as the extracting electrode such that electrons emitted from the source are accelerated toward the opening of the reservoir for bombarding a compound to heat and ionize it;
   (e) a grounded electrode having an opening, said grounded electrode being spaced beyond the electron source from the reservoir;
   (f) a high D.C. voltage supply for maintaining the reservoir at positive high potential relative to the grounded electrode; and
   (g) an extracting D.C. voltage supply for maintaining the extracting electrode at negative potential relative to the reservoir.

7. An ion source according to claim 6 in which said needle is made of tantalum.

8. An ion source according to claim 6 in which said reservoir is made of tungsten.

* * * * *